United States Patent
Bernardinis et al.

(10) Patent No.: US 10,180,448 B2
(45) Date of Patent: Jan. 15, 2019

(54) CIRCUIT AND METHOD FOR PULSE WIDTH MODULATION

(71) Applicant: Analog Devices, Inc., Norwood, MA (US)

(72) Inventors: Gabriele Bernardinis, Los Gatos, CA (US); Michael Daly, San Jose, CA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 15/146,647

(22) Filed: May 4, 2016

(65) Prior Publication Data
US 2016/0336957 A1   Nov. 17, 2016

Related U.S. Application Data

(60) Provisional application No. 62/162,447, filed on May 15, 2015.

(51) Int. Cl.
*H03K 7/08* (2006.01)
*G01R 29/02* (2006.01)
*H03M 3/00* (2006.01)

(52) U.S. Cl.
CPC .......... *G01R 29/023* (2013.01); *H03K 7/08* (2013.01); *H03M 3/432* (2013.01); *H03M 3/464* (2013.01)

(58) Field of Classification Search
CPC ......... G01R 29/00; G01R 29/023; G05F 1/00; G05F 1/561; H03F 1/00; H03F 1/3211; H03F 3/00; H03F 3/45179; H03F 3/45197; H03F 3/45475; H03K 7/00; H03K 7/08; H03M 3/00; H03M 3/432; H03M 3/464

USPC ......................................................... 327/103
See application file for complete search history.

(56) References Cited

U.S. PATENT DOCUMENTS

| | | | |
|---|---|---|---|
| 6,807,075 B2 | 10/2004 | Miermans | |
| 7,906,917 B2 | 3/2011 | Tripathi et al. | |
| 8,502,420 B1 | 8/2013 | Mogilevski | |
| 9,882,493 B2 | 1/2018 | Daly | |
| 2009/0237280 A1* | 9/2009 | Ashmore, Jr. | H03M 3/382 341/120 |
| 2010/0156686 A1* | 6/2010 | Kim | H03K 3/3565 341/143 |
| 2012/0294048 A1 | 11/2012 | Brinlee | |
| 2015/0280576 A1 | 10/2015 | Hinz et al. | |

(Continued)

OTHER PUBLICATIONS

"Chapter 2—Basics of Sigma-Delta Modulation", In: Look-Ahead Based Sigma-Delta Modulation, Janssen, E., et al., Springer Science+Business Media B.V., (2011), 5-28.

(Continued)

*Primary Examiner* — Lincoln Donovan
*Assistant Examiner* — David Mattison
(74) *Attorney, Agent, or Firm* — Schwegman Lundberg & Woessner, P.A.

(57) ABSTRACT

A delta-sigma modulator circuit comprising: an integrator circuit configured to produce an integrator output signal that represents an integration of an analog input signal, a comparator output signal and a periodic signal; a comparator circuit configured to produce the comparator output signal in response to a comparison of the integrator output signal with a first reference signal; and a periodic signal generation circuit configured to produce the periodic signal.

26 Claims, 8 Drawing Sheets

(56) References Cited

U.S. PATENT DOCUMENTS

2016/0126968 A1* 5/2016 Lesso .................. H03M 1/18
                                                    341/155
2016/0336862 A1    11/2016 Daly et al.

OTHER PUBLICATIONS

Baker, Bonnie, "How delta-sigma ADCs work, Part 1", Analog Applications Journal, (c) 2011, Texas Instruments Incorporated, (2011), 6 pgs.
"U.S. Appl. No. 15/146,635, Notice of Allowance dated Mar. 9, 2017", 23 pgs.
"U.S. Appl. No. 15/146,635, Notice of Allowance dated Jun. 20, 2017", 11 pgs.
"U.S. Appl. No. 15/146,635, Preliminary Amendment filed Jun. 7, 2017", 9 pgs.
"U.S. Appl. No. 15/146,635, Notice of Allowance dated Oct. 11, 2017", 10 pgs.
"U.S. Appl. No. 15/146,647, Preliminary Amendment filed Sep. 20, 2017", 9 pgs.

\* cited by examiner

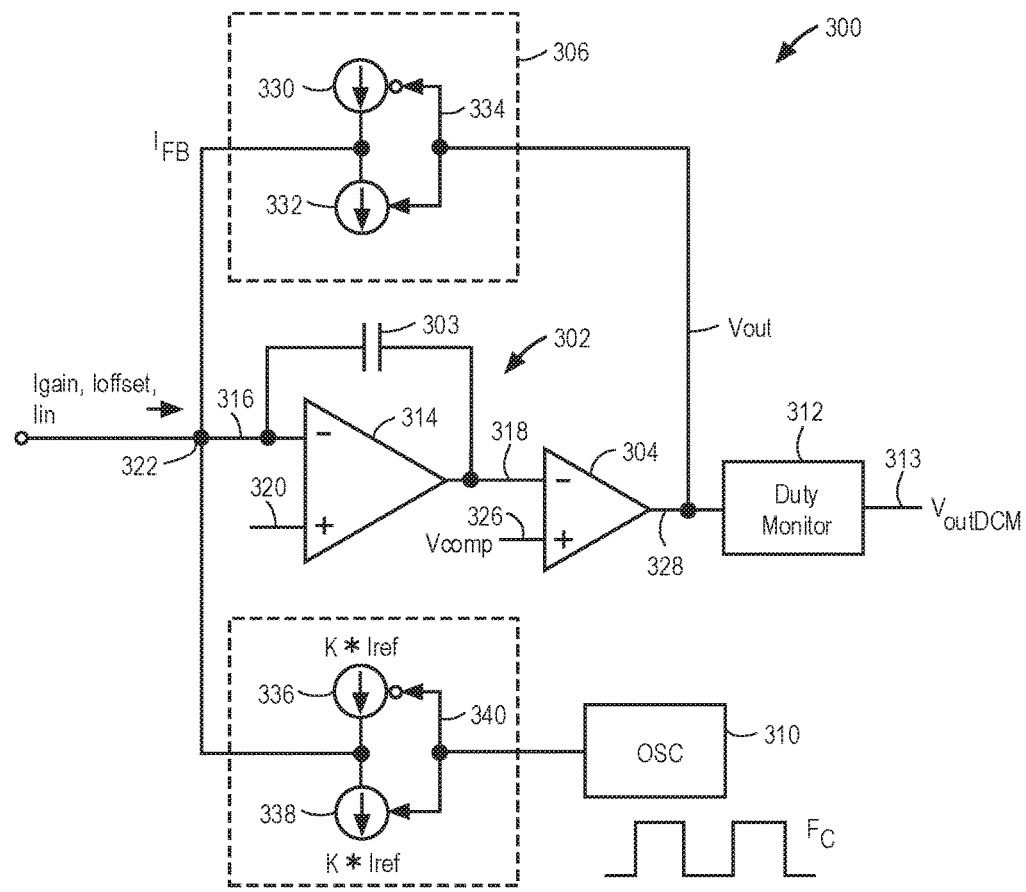
FIG. 3
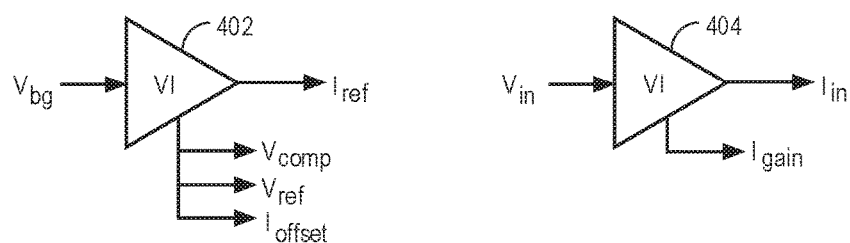
FIG. 4A
FIG. 4B

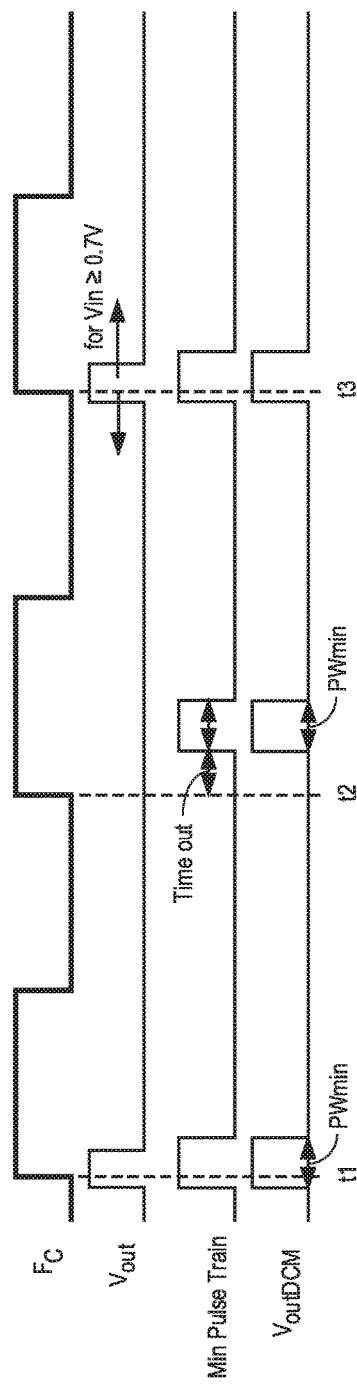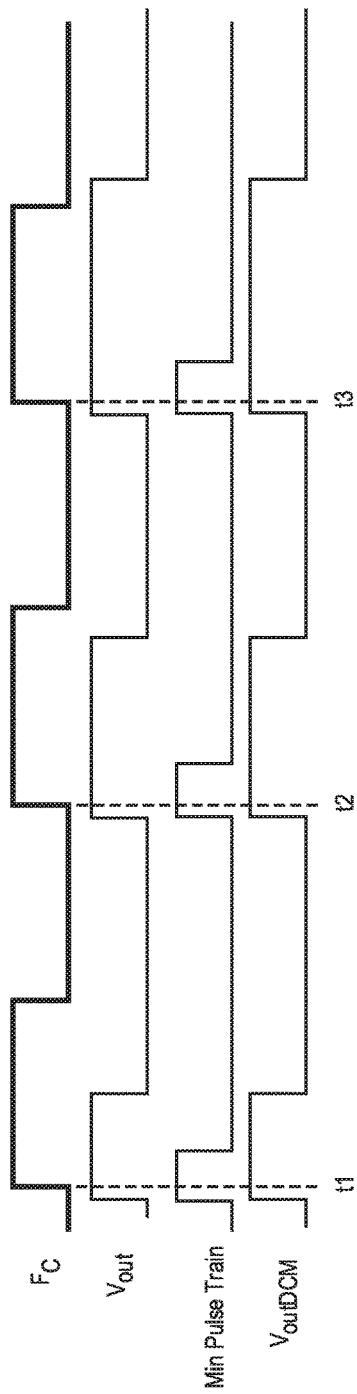

CIRCUIT AND METHOD FOR PULSE WIDTH MODULATION

CLAIM OF PRIORITY

This Application claims the benefit of priority to U.S. Provisional Patent Application Ser. No. 62/162,447, filed May 15, 2015, which is incorporated herein by reference in its entirety.

BACKGROUND

Delta sigma modulation transforms an analog input signal into a digital like pulse width modulated two-state bit stream that can be transmitted more reliably through a noisy communication channel. A delta-sigma pulse width modulator includes an integrator that integrates the difference between an input signal and a feedback signal. The feedback signal is proportional to the output of the modulator, which in turn is the result of the comparison between periodic waveform, typically a triangle or saw-tooth waveform, and the integrator output. Thus, a continuous time varying, analog, input signal is converted to a pulse width modulated digital signal. At the receiving side, a synchronous demodulator reconstructs the envelope of the transmitted signal.

FIG. 1 is an illustrative circuit diagram representing a known delta sigma PWM modulator circuit 100. The illustrative example delta sigma modulator circuit (the "modulator") 100 includes an integrator circuit 102 including an integrating capacitor 103, a comparator circuit 104, a one-bit digital-to-analog converter ("DAC") circuit 106 and a periodic clock signal generator circuit 108 coupled as shown. The example integrator 102 includes an operational amplifier circuit 110 that includes external first input node 114 coupled to receive an analog input signal, a second node 114 coupled to receive a reference signal, and an integrator output node 116. In some embodiments, the first input node 112 is coupled to an inverted input of the amplifier 110 and the second node 114 is coupled to a non-inverted input of the amplifier 110. The integrator includes the integrator capacitor ($C_{int}$) 103 coupled between the integrator output node 116 and the first input node 112. A resistance R is coupled to the first input node 112 to act as a trans-conductance to covert an external analog input voltage signal to an analog input current signal. The first input node 112 is coupled to a summing node 118 whereat an analog input current signal and a feedback signal are summed together. Changes in the value of the sum occur with time varying changes in the analog input signal and corresponding changes in the feedback signal result in charging and discharging of the integrating capacitor ($C_{int}$) 103. During normal operation, the example integrator 102 produces a time varying integrator output voltage that is proportional to the integral of the difference between the external input analog signal and the feedback signal.

The example comparator circuit 104 includes first input node 120 coupled to be responsive to an output voltage signal provided by the integrator circuit 102 and includes a second input node 122 coupled to be responsive to a periodic reference voltage signal produced by the periodic clock waveform generator circuit 108. In some embodiments, the periodic clock signal waveform generator circuit 108 produces a periodic triangle wave voltage signal. Alternatively, in some embodiments the periodic clock signal generator circuit 108 produces a different signal shape having a ramp component such as a saw-tooth wave voltage signal. In some embodiments, the first and second input nodes 120, 122, of the comparator circuit 104 are coupled to its inverting and non-inverting inputs, respectively. The comparator 104 produces a continuous time output signal at a comparator output node 124 that is indicative of the integrator output signal. The comparator output signal is provided as a feedback input to the one-bit DAC circuit 106.

The example one-bit DAC 106 includes switch circuitry 126 responsive to the comparator output signal that selectively couples the integrator's input node to either an $I_{ref}$ source 128 reference current or to an $I_{ref}$ sink 130 reference current to thereby convert the comparator output voltage signal to a comparator feedback current signal. More particularly, in response to the comparator output signal, which also acts as the modulator output voltage signal, the DAC's switch circuitry 126 couples a selected one or the other of the $I_{ref}$ source 128 and the $I_{ref}$ sink 130 to the integrator's input node 112, so as to generate a square wave current signal at the integrator input node whose average value for every PWM period is proportional to the PWM modulator output voltage. FIG. 2 is an illustrative block diagram representing certain details of an example known periodic clock waveform signal generator circuit 108 used in some embodiments of the modulator of FIG. 1. The example periodic clock waveform generator circuit 106 includes an oscillator circuit 132 that produces a periodic square wave having frequency $F_C$ that is used to produce a PWM triangle waveform whose period is $1/F_C$. The periodic clock signal generator 108 includes an $I_{PWM}$ current source 134 and an $I_{PWM}$ current sink 136 and a capacitor ($C_{osc}$) 138. Switch circuitry 140 is configured to alternately couple the $I_{PWM}$ source 134 and the $I_{PWM}$ sink $_{136}$ to the capacitor ($C_{osc}$) 138 in response to the periodic square wave so as to alternately charge and discharge the ($C_{osc}$) 138. The alternate charging and discharging of the ($C_{osc}$) 138 produces a triangle waveform that is provided at a reference node of the example comparator of some embodiments of the modulator of FIG. 1.

SUMMARY

In one aspect, a delta-sigma modulator circuit includes an integrator circuit configured to produce an integrator output signal that represents an integration of an analog input signal, a comparator output signal and a periodic signal. A comparator circuit is configured to produce the comparator output signal in response to a comparison of the integrator output signal with a first reference signal. A periodic signal generation circuit configured to produce the periodic signal.

In another aspect, a delta-sigma modulator circuit includes an integrator circuit configured to produce an integrator output signal that represents an integration of an analog input signal, a comparator output signal and a periodic signal. A comparator circuit is configured to produce the comparator output signal in response to a comparison of the integrator output signal with a first reference signal. A periodic signal generation circuit configured to produce the periodic signal A duty cycle monitor circuit is configured to detect time between comparator output signal pulses and to modify the comparator output signal by inserting a pulse in response to a determination that a received pulse is less than a minimum pulse width and by subtracting a pulse in response to a determination that a received pulse is greater than a maximum pulse width and to provide the modified comparator output signal on a communication channel. A a demodulator circuit is configured to produce, in response to the modified comparator output signal on a communication channel, an analog output signal that is a replica of the analog input signal.

BRIEF DESCRIPTION OF THE DRAWINGS

FIG. 3 is an illustrative circuit diagram representing a first delta sigma PWM modulation circuit in accordance with some embodiments.

FIGS. 4A-4B are illustrative drawings representing first and second voltage-to-current circuits, respectively, in accordance with some embodiments.

FIGS. 7A-7C are illustrative timing diagrams representing example pulse insertions performed using the duty cycle monitor circuit to maintain an output signal within a prescribed frequency range in accordance with some embodiments.

DESCRIPTION OF EMBODIMENTS

Figure 1:
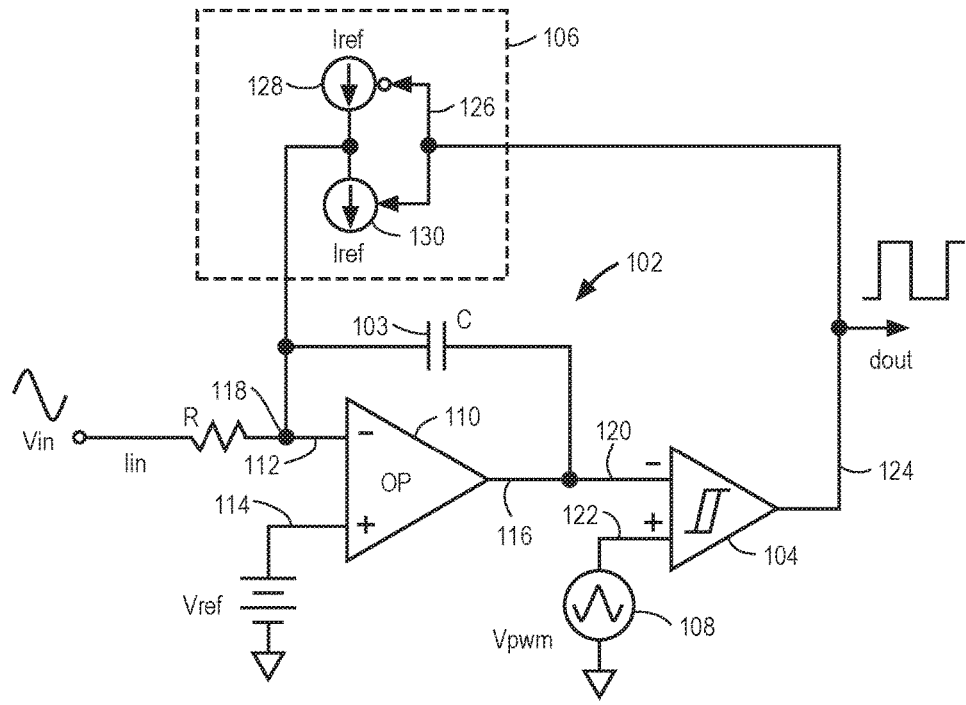
FIG. 1 is an illustrative circuit diagram representing a known delta sigma PWM modulator circuit.
Figure 2:
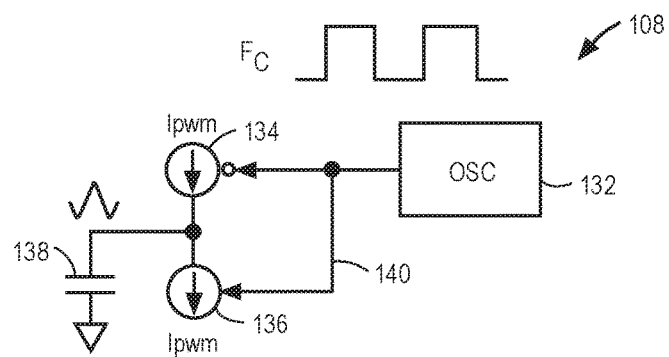
FIG. 2 is an illustrative block diagram representing certain details of an example known periodic waveform signal generator circuit used in some embodiments of the modulator of FIG. 1.

The following description is presented to enable any person skilled in the art to create and use a delta sigma PWM modulator with integrator capacitor circuitry coupled to produce an integration voltage as a function of a comparator output feedback signal and a periodic waveform signal. Various modifications to the embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known processes are shown in block diagram form in order not to obscure the description of the invention with unnecessary detail. Identical reference numerals may be used to represent different views of the same or similar item in different drawings. Flow diagrams in drawings referenced below are used to represent processes. Thus, the present invention is not intended to be limited to the embodiments shown, but is to be accorded the widest scope consistent with the principles and features disclosed herein.

FIG. 3 is an illustrative circuit diagram representing a first delta sigma modulator circuit 300 in accordance with some embodiments. The first delta sigma modulator circuit (the "first modulator") 300 includes an integrator circuitry ($C_{int}$) 302, which includes an integrating capacitor 303, a comparator circuit 304, a first DAC circuit 306, a second DAC circuit 308, an oscillator circuit 310, and a duty monitor circuit 312 coupled as shown. The first modulator 300 also includes first and second voltage-to-current circuits 402, 404 shown in FIGS. 4A-4B, respectively. In some embodiments, the integrator circuit 302 includes a voltage amplifier circuit 314. The integrating capacitor 303 is coupled between a first input node 316 and an output node 318 of the amplifier circuit 314. In some embodiments, the amplifier circuit 302 includes an operational amplifier circuit and the integrating capacitor 303 is coupled between an inverting input node and an output node of the amplifier circuit 302. The integrator circuit 302 in effect, performs the mathematical operation of Integration in that it produces an output voltage that responds to changes in the input voltage over time to produce an output voltage which is proportional to the integral of the input voltage. In other words the magnitude of the integrator output voltage signal is determined by the length of time a voltage is present at the integrator first input node as a sum of currents at the integrator's first input node charges or discharges the integrating capacitor 303.

The integrator 302 preferably produces an integrator output voltage value at its output node 318 that is representative of the integral of the difference between a continuous time varying, analog input current $I_{in}$ signal provided at first input node 316 of the operational amplifier and a feedback current signal indicative of the value of an output voltage signal produced by the comparator 304. The DAC 306 converts the comparator voltage feedback signal to a feedback current signal.

Specifically, the amplifier circuit 314 includes a first input node 316 that acts as an inverting input node and includes a second input node 320 that acts as a non-inverting input node. Integrating capacitor circuitry ($C_{int}$) 303 is coupled between the integrator's first input node 316 and its output node 318 to provide an integrator output voltage. The integrator's first input node 316, which is coupled to a current a summing node 322, is coupled to receive an external analog input signal and a feedback signal. The integrator's second input node 320 is coupled to receive a first reference voltage $V_{ref}$.

The comparator circuit 304 includes a third input node 324 and a fourth input node 326 and a comparator output node 328. The third input node 324 is coupled to a negative (invert) input to receive the integrator output voltage provided at the integrator output node 318. The fourth input node 326 is coupled to a positive (non-invert) input to receive a reference comparison voltage value $V_{comp}$. The comparator 304 produces an output signal voltage feedback value $V_{out}$ indicative of a difference between voltage values provided on its input nodes 324, 326. The first DAC circuit 306 is coupled to convert the output feedback voltage signal $V_{out}$ to a first feedback current signal $I_{FB}$ and to provide the first feedback current signal as a feedback current signal to the first input node 316 of the integrator. More particularly, the first DAC 306 includes an $I_{ref}$ reference current source 330 and an $I_{ref}$ reference current sink 332 and switch circuitry 334 responsive to the comparator output signal $V_{out}$ that selectively alternately couples one of the $I_{ref}$ source 330 and the $I_{ref}$ sink 334 to the integrator's first input node 316 so as to provide a first current waveform signal component at the first integrator first input node 316 that is a function of the PWM output voltage $V_{out}$ of the comparator circuit 304.

The oscillator circuit 310 produces a periodic waveform signal used to define the frequency at which the analog to digital converter outputs the converted signal. In essence, $F_c$ defines a maximum bandwidth of the signal converted.

The second DAC 308 is coupled to convert the oscillator voltage signal $V_{FC}$ to an oscillator current signal $I_{FC}$ and to provide the oscillator current signal $I_{FC}$ as a periodic second current waveform signal component to the first input node 316 of the integrator 302. The second DAC 308 includes a $k*I_{ref}$ reference current source 336 and a $k*I_{ref}$ reference current sink 338. The second DAC 308 includes switch circuitry 340 to alternately couples one of the $k*I_{ref}$ source and $k*I_{ref}$ sink signals to the first input 316 to the integrator 302 in response to the oscillator output signal. In accordance with some embodiments, preferably the oscillator circuit 310 produces square wave with a fixed fifty percent duty cycle.

Referring to FIG. 4A, the first voltage-to-current converter circuit 402 receives a bandgap signal reference voltage signal $V_{bg}$ and produces output current signals $I_{ref}$ and $I_{offset}$ and also produces output voltage signals $V_{ref}$ and $V_{comp}$. More particularly, the first voltage-to-current circuit scales $V_{bg}$ to produce $V_{comp}$ and $V_{ref}$. In some embodiments, the first voltage-to-current converter uses a first reference resistor network to produce voltage signal $V_{ref}$ and current signal $I_{ref}$ based upon voltage $V_{bg}$ to voltage signal $V_{ref}$ and current signal $I_{ref}$. In some embodiments, the first voltage-to-current converter uses current mirror circuitry to produce $I_{offset}$ and $k*I_{ref}$ based upon $I_{ref}$. The value k is k>1. Generally speaking, k is selected to be greater than one so as to ensure system stability. However, an increased value of k reduces system gain. Thus, a value of k is selected that is larger than one but that is small enough to not reduce system gain to a value that is smaller than a required value of gain. It will be appreciated that $I_{offset}$ and $k*I_{ref}$ represent scaled replicas of $I_{ref}$. For example, in accordance with some embodiments, $I_{offset} = \pm n1 I_{ref}$.

Referring to FIG. 4B, the second voltage-to-current converter circuit 404 receives the analog signal voltage $V_{in}$ and produces analog current signals $I_{in}$ and $I_{gain}$. In some embodiments, the first voltage-to-current converter uses a second reference resistor network to produce the current signal $I_{in}$ based upon the time varying analog input signal voltage $V_{in}$. In some embodiments, the second voltage-to-current converter uses current mirror circuitry to produce the $I_{gain}$ based upon $I_{in}$. It will be appreciated that $I_{gain}$ represents a scaled replica of $I_{in}$. For example, in accordance with some embodiments, $I_{gain} = \pm n2 I_{in}$.

Thus, the first modulator 300 includes integrating capacitor circuitry ($C_{int}$) 303 coupled to integrate the input current $I_{in}$, the feedback signal coming from the current DAC, and a square wave current so as to generate a triangle waveform at the output of the integrator. In some embodiments, the triangle waveform at the output of the integrator obviates a need for a standalone triangle (or ramp) waveform input to the comparator in the previous art. An example advantage of such integrator capacitor circuitry configuration in accordance with some embodiments is that the comparator 304 compares the integrator output signal to the fixed comparison value $V_{comp}$, which preferably is set to mid supply rail, which relaxes performance requirements of the comparator 304 and simplifies its design, since comparison is made with respect to the reference comparison signal $V_{comp}$ rather than with a periodic waveform signal.

Another example advantage in accordance with some embodiments is that the voltage range of the integrator's output signal preferably can be extended closer to the supply rail without resulting in distortion when the analog input signal frequency is close to the upper limit of the modulator bandwidth. Thus, better SNR of the modulator 300 can be achieved without requiring an overall higher performance comparator 304, e.g., without requiring a comparator that has the same error at all voltage levels of a saw-tooth ramp, between minimum and maximum voltage of the ramp. More specifically, for example, use of a fixed reference comparison value $V_{comp}$ in accordance with some embodiments, causes the comparator 304 to trigger at or about a fixed voltage level, and although a faster rising edge impacts comparator delay, the feedback loop around comparator via the first DAC 306 and the integrating capacitor 303 shifts the average of the integrator output enough to compensate for that delay, such that there is substantially no resulting delay impact upon the actual output of the comparator.

In accordance with some embodiments, the oscillator frequency preferably is selected so that the bandwidth of the first modulator tracks the PWM frequency by approximately a fixed ratio. More particularly, in some embodiments, the oscillator frequency is selected so that its period is proportional to $R_{ref}*C$, $$T_{osc} = \alpha R_{ref} C$$

where Rref is the value of a resistor used to generate the current $I_{ref}$ as a ratio of the reference voltage $V_{ref}$ over $R_{ref}$, and C is the value of the integrator capacitor. If the above value of $T_{OSC}$ is selected, then the bandwidth of the first modulator tracks the PWM frequency by a fixed ratio that is, in first order, input voltage and temperature independent and given by the following relationship, $$f_{UG} = \frac{2 f_{OSC}}{k\pi}$$

where $f_{osc}$ is the oscillator frequency and $f_{UG}$ is the unity gain bandwidth of the modulator.

A duty cycle monitor (DCM) circuit 312 produces a signal $V_{outDCM}$ in response to the comparator output voltage signal $V_{out}$ that acts as a frequency-corrected version of $V_{out}$ to ensure that the modulator 300 produces an output signal that remains within a selected frequency range. Preferably, frequency and pulse widths remain within prescribed maximum and minimum values. In some embodiments, the duty cycle monitor circuit 312 monitors frequency of occurrence of pulses to ensure that pulses occur within the selected frequency range. More specifically, in some embodiments, the duty cycle monitor circuit 312 monitors pulse width to ensure that pulses having at least a minimum pulse width or a maximum pulse width occur within the selected $T_{osc} = 1/f_{osc}$. In accordance with some embodiments, the modulator and a corresponding demodulator are designed to operate within a certain analog signal $V_{in}$ input signal amplitude and frequency range, which corresponds to a minimum and maximum comparator output voltage $V_{out}$ duty cycle. The duty monitor circuit 312 limits the output voltage duty cycle of modulator output signal $V_{outDCM}$ transmitted to a demodulator (discussed below) to a range between a minimum duty cycle value and a maximum duty cycle value, guaranteeing a substantially constant frequency of $D_{outDCM}$. It will be appreciated that in practice, the frequency of of $D_{outDCM}$ can vary slightly, for example, due to time delay incurred while detecting that a pulse is missing.

Figure 5:
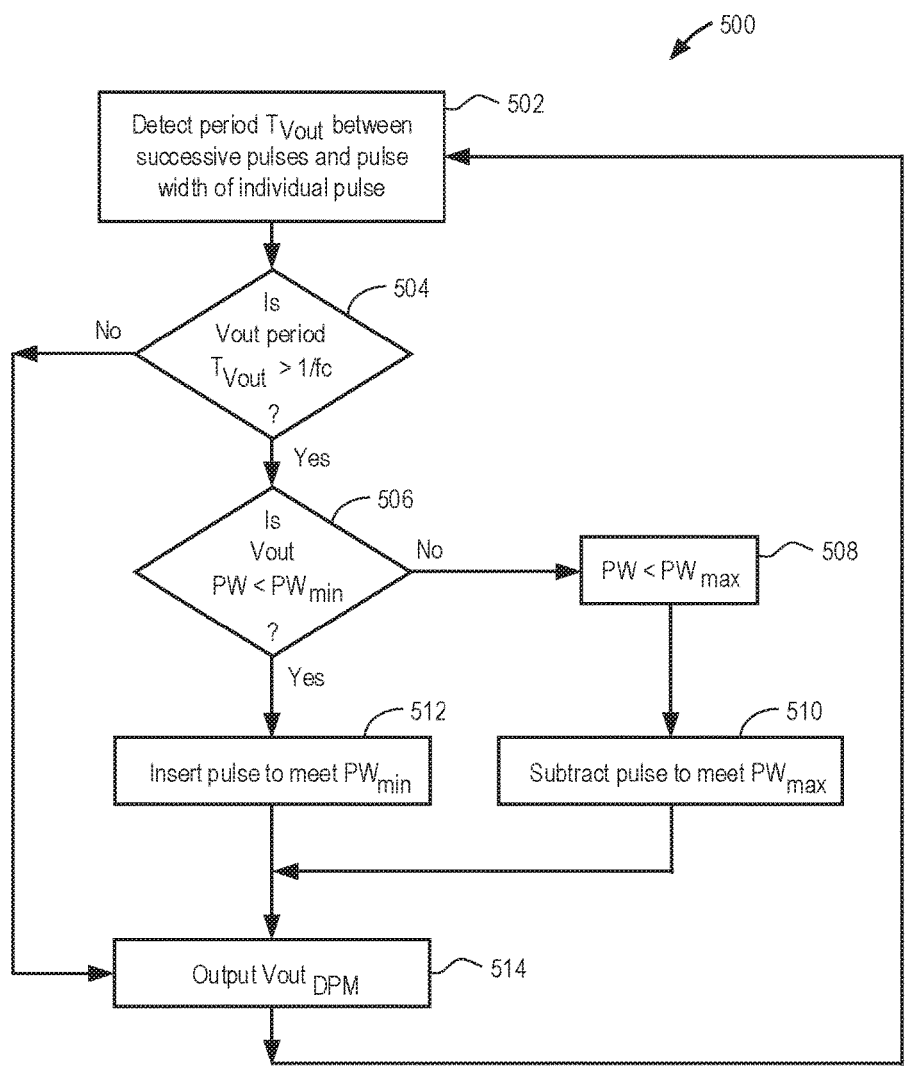
FIG. 5 is an illustrative flow diagram that represents operation of the duty cycle monitor circuit in accordance with some embodiments.

FIG. 5 is an illustrative flow diagram that represents operation of the duty cycle monitor circuit 312 in accordance with some embodiments. The functions represented by the modules of FIG. 5 correspond to logic circuitry configured to perform the functions. Module 502 monitors the time period $T_{Vout}$ between successive pulses and also monitors pulse width of individual pulses. Decision module 504 determines whether for a current $V_{out}$ pulse, $T_{Vout} > 1/f_C$. In response to a determination that $T_{Vout}$ for the present $V_{out}$ pulse is not greater than $1/f_C$, module 514 inserts the current $V_{out}$ pulse into the output pulse stream of the DCM circuit 312 and control flowsback to module 502. In response to a determination that the $T_{Vout}$ for the present $V_{out}$ pulse is greater than $1/f_C$, decision module 506 determines whether for the present $V_{out}$ pulse $PW < PW_{min}$. In response to a determination that by decision module 506 that PW is not less than $PW_{min}$, module 508 determines that for the present $V_{out}$ pulse $PW > PW_{max}$, and module 510 subtracts a pulse from the output pulse stream of the DCM circuit 312, and control flows back to module 502. In response to a determination that by decision module 506 that PW is less than $PW_{min}$, module 512 inserts a pulse in the the output pulse stream of the DCM circuit 312, and control flows back to module 502.

Figure 6A:
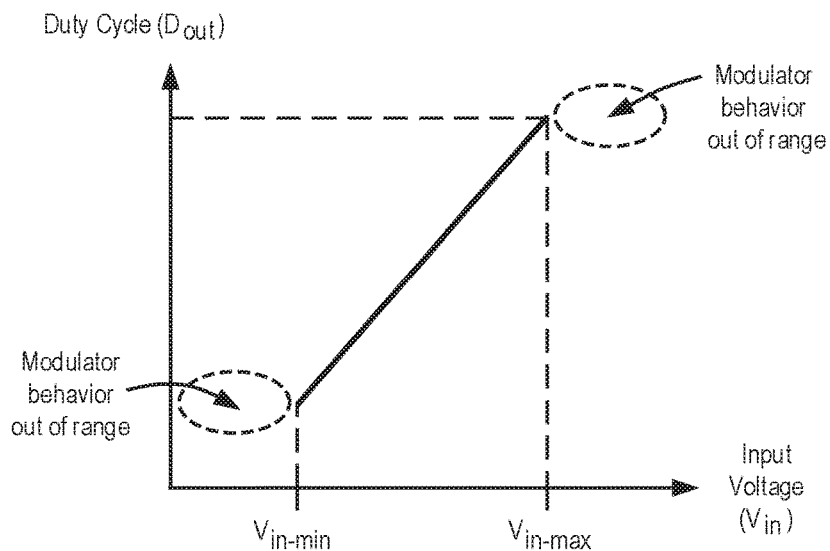
FIGS. 6A-6B are illustrative drawings showing example curves representing duty cycle versus input signal relationships in accordance with some embodiments.
Figure 6B:
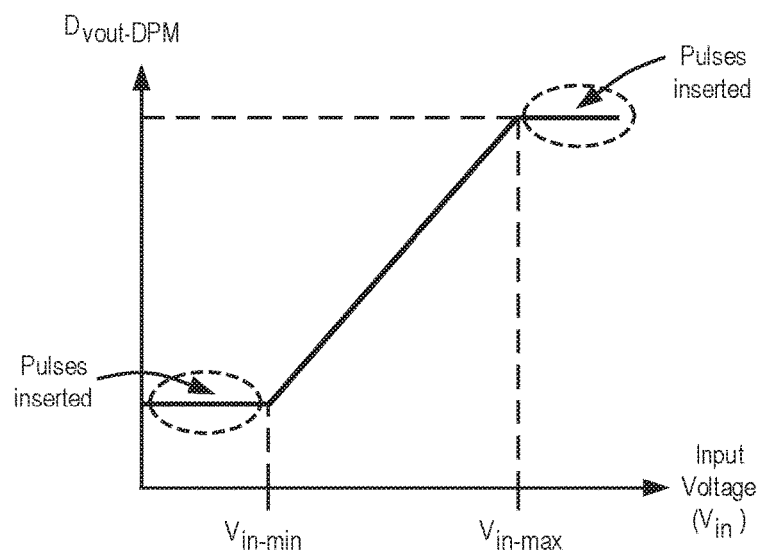

FIGS. 6A-6B are illustrative drawings showing example curves representing a $D_{Vout}$ vs $V_{in}$ relationship (FIG. 6A) and a $D_{VoutDCM}$ vs $V_{in}$ relationship (FIG. 6B) in accordance with some embodiments. FIG. 6A shows an example curve representing an example duty cycle of the $V_{out}$ signal on line 328 versus a $V_{in}$ analog input signal. FIG. 6B shows an example curve representing an example duty cycle of the $V_{outDCM}$ signal on line 313 versus the $V_{in}$ signal. It will be appreciated that the the $V_{out}$ signal on line 328 is an input signal to the duty cycle monitor circuit 312 and that the $V_{outDCM}$ signal on line 313 is an input signal to the duty cycle monitor circuit 312.

FIGS. 6A-6B illustrate that the output voltage duty cycle $D_{Vout}$ of the PWM output signal $V_{out}$ is substantially proportional to voltage level of the $V_{in}$ continuous time (analog) input signal in accordance with some embodiments. Additionally, the illustrative drawing of FIG. 6A conceptually represents that the example $V_{out}$ signal that includes aberrant $V_{out}$ signal behavior in which the period between pulses is out of range due to the modulator skipping pulses or producing abnormally long pulses, for example. Additionally, the illustrative drawing of FIG. 6B conceptually represents that the duty cycle monitor circuit 312 inserts pulses to account for the skipped pulses so as to maintain the duty cycle within a prescribed duty cycle range between $D_{Voutmax}$ and $D_{Voutmin}$ in accordance with some embodiments.

Currents $I_{gain}$ and $I_{ref}$ are used to correct gain errors and offset errors, respectively. Persons skilled in the art will understand that a change in gain changes the slope of the $D_{Vout}$ vs $V_{in}$ curve, and that a change in offset moves the $D_{Vout}$ vs $V_{in}$ curve up or down without changing its slope. In accordance with some embodiments, gain and/or offset correction are achieved by selectively injecting $I_{gain}$ and $I_{ref}$, respectively, to the first input node 316 of the integrator 302.

In effect, the duty cycle monitor circuit 312 imposes a pulse frequency clamp to an output frequency $V_{outDCM}$ duty cycle within prescribed frequency limits. Exceeding the limits of the frequency range could impact the linearity of the $V_{in}$, $V_{out}$ relation, which ideally is $V_{out} = V_{in}$. The duty monitor circuit 312 addresses situations, for example, in which a condition, $V_{in} < V_{min}$ occurs, which could potentially result in an output $V_{out} > V_{max}$, for example. In some embodiments, the duty cycle monitor circuit 312 operates to inject a minimum pulse width $PW_{min}$ when $D_{VoutDCM} < D_{Voutmin}$. Alternatively, in some embodiments, the duty cycle monitor circuit 312 operates to limit the pulse width to $PW_{max}$ when $D_{VoutDCM} > D_{Voutmax}$. Yet another alternative embodiment limits the input voltage $V_{in}$ to be $V_{inmin} < V_{in} < V_{inmax}$.

Figure 7C:
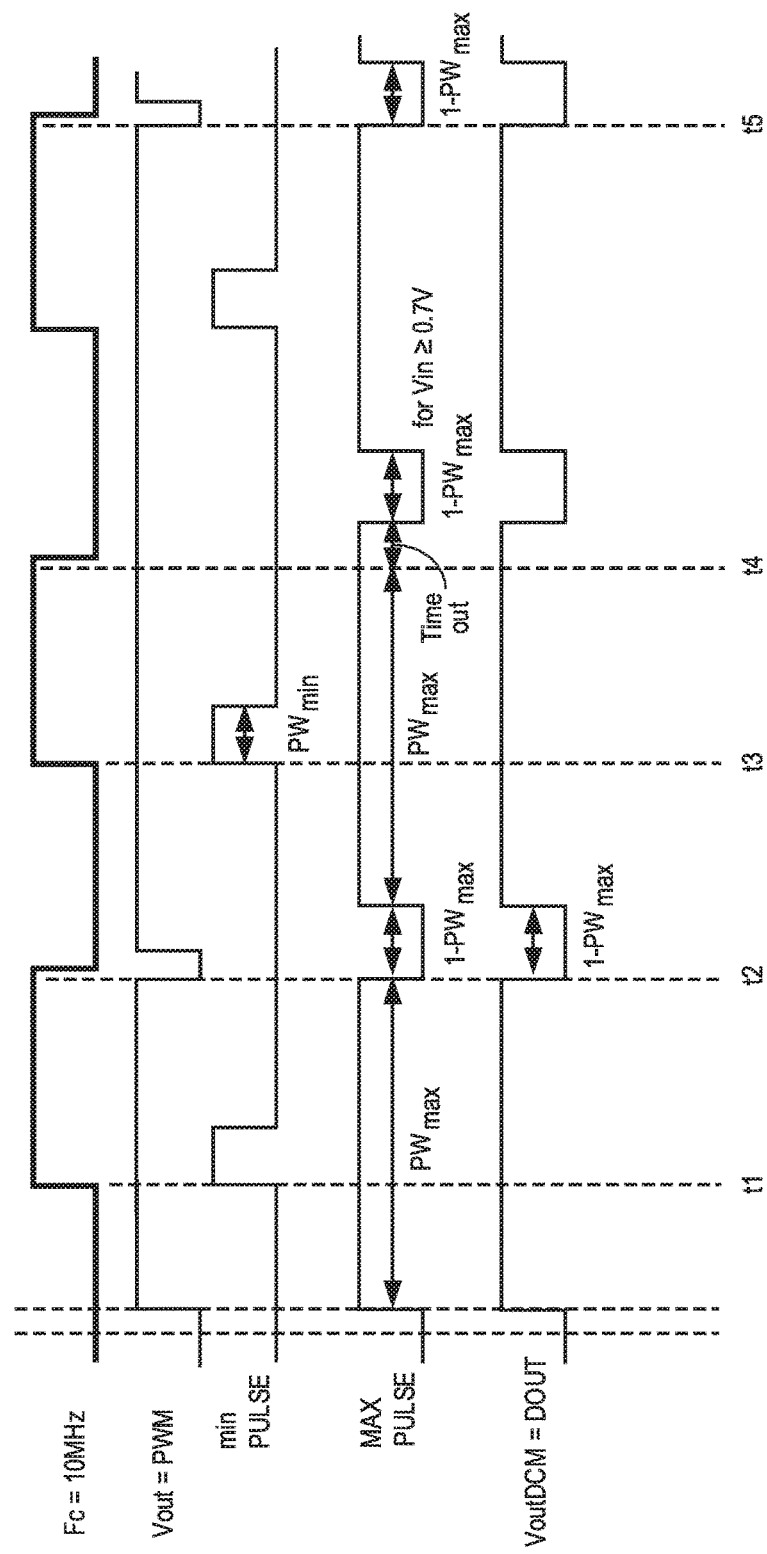

FIGS. 7A-7C are illustrative timing diagrams representing example modification by the DCM circuit 312 of a PWM $V_{out}$ signal produced by the modulator 300, 800 so as to maintain a PWM $V_{outDCM}$ signal within a prescribed frequency range in accordance with some embodiments. The periodic signal generator 310 produces a clock signal having frequency $F_C$. The DCM circuit 312 passes through $V_{out}$ pulses without change to the $V_{outDCM}$ signal except when pulse insertions or deletions are required to maintain the frequency of the $V_{outDCM}$ signal within a prescribed frequency range.

Referring to FIGS. 7A-7B, in accordance with some embodiments, the DCM circuit 312 produces a periodic pulse train having the minimum pulse width $PW_{min}$. The DCM circuit 312 monitors pulses within the $V_{out}$ signal and determines whether the $V_{out}$ signal fails to produce a pulse within a prescribed time interval. More particularly, in accordance with some embodiments, the the DCM circuit 312 determines whether the $V_{out}$ signal includes a pulse that occurs within a selected first time interval referred to herein as "first time out" interval following each rising edge of the clock signal $F_C$. In response to a determination that the $V_{out}$ signal is missing a pulse within the timeout interval following a rising clock edge, the DCM circuit 312 inserts an additional pulse having $PW_{min}$ into the $V_{outDCM}$ pulse train. Referring to FIG. 7A, the example $V_{out}$ signal does not include a pulse that occurs within the time out interval following the rising clock edge at time t3. Therefore, a pulse having pulse width $PW_{min}$ is inserted at about time t2 in the $V_{outDCM}$ signal. In some embodiments, a pulse from the minimum pulse train is output to the $V_{outDCM}$ signal to achieve the $PW_{min}$ pulse insertion.

Referring to FIG. 7C, in accordance with some embodiments, the DCM circuit 312 produces a periodic pulse train having the maximum pulse width $PW_{max}$. The DCM circuit 312 monitors pulses within the $V_{out}$ signal and determines whether the $V_{out}$ signal includes a pulse that is longer than the maximum pulse width $PW_{max}$. In response to a determination that the $V_{out}$ signal includes a pulse that is longer than the maximum pulse width $PW_{max}$, the DCM circuit 312 inserts at least one additional pulse having $PW_{max}$ into the $V_{outDCM}$ pulse train. Referring to FIG. 7C, the example $V_{out}$ signal includes a pulse that extends from just after t2 so time t5, which is longer than $PW_{max}$. In this example, two pulses having a pulse having pulse width $PW_{max}$ are inserted between time t2 and time t5 in place of the Vout pulse that exceeds PWmax. In some embodiments, pulses from the maximum pulse train are output to the $V_{outDCM}$ signal to achieve $PW_{max}$ pulse insertion.

Referring again to FIG. 7B, the example $V_{out}$ signal includes a pulse that occurs within the time out interval following each rising clock edge. Moreover, none of the $V_{out}$ pulses has a pulse width that is greater than $PW_{max}$. Therefore, the $V_{out}$ pulse sequences is output directly to the $V_{outDCM}$ signal with neither insertion nor deletion of pulses.

Figure 8:
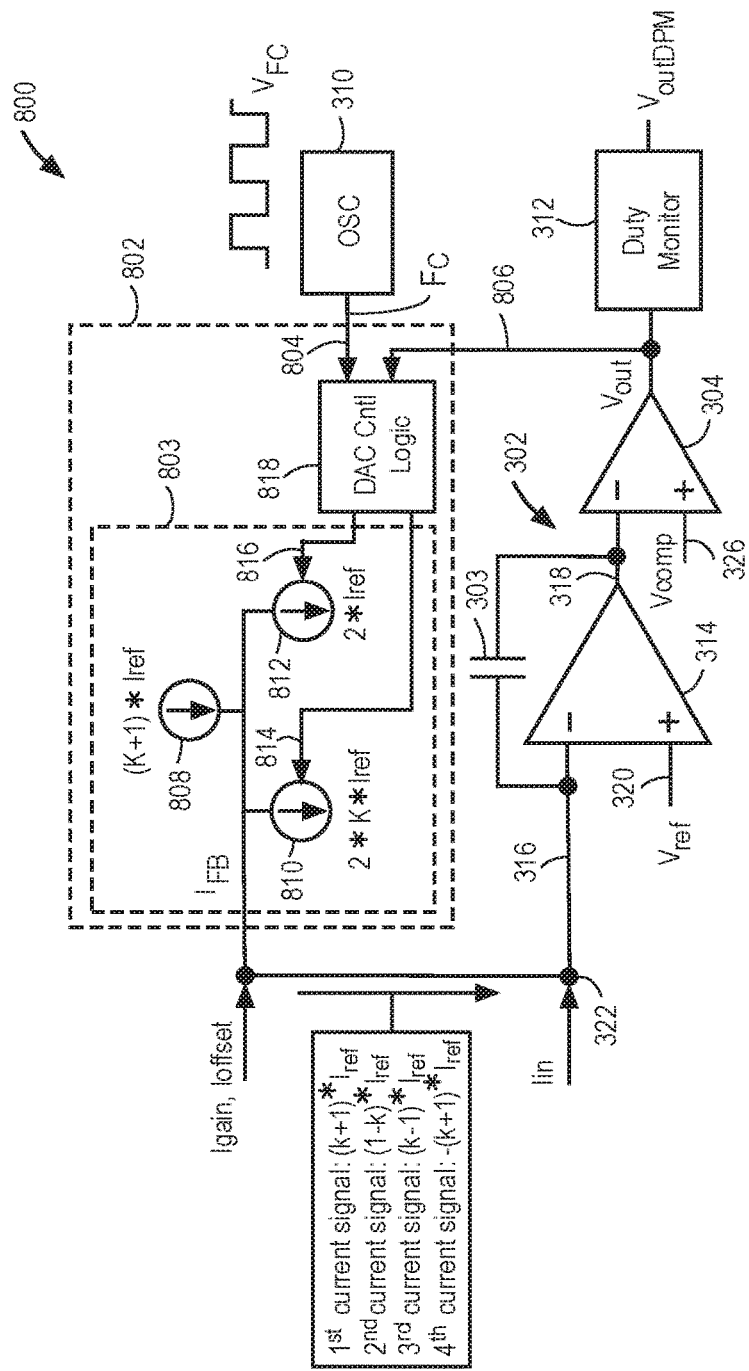
FIG. 8 is an illustrative circuit diagram representing a second delta sigma PWM modulator circuit in accordance with some embodiments.

FIG. 8 is an illustrative circuit diagram representing a second delta sigma modulator circuit (the second "modulator") 800 in accordance with some embodiments. Corresponding components of the first and second modulators are identified with identical reference numerals. A feedback control current source 802 that includes a first input node 804 coupled to receive a periodic sampling signal $F_C$ produced using oscillator 310 and includes a second input node 806 coupled to receive an output voltage $V_{out}$ produced using comparator 304. The feedback control current source 802 provides a feedback current control signal $I_{FB}$ control signal to the first input node 316 of the integrator 302 in response to the periodic sampling signal and the comparator output feedback signal.

In some embodiments, the feedback control current source 802 includes a DAC 803 that includes $(k+1)*I_{ref}$ current source 808, which provides a first current signal, includes $2k*I_{ref}$ current sink 810, which provides a second current signal, and includes $2*I_{ref}$ current sink 812, which provides a third current signal. The DAC 803 includes first switch circuitry 818 to selectively couple the $2*k*I_{ref}$ current sink 810, which provides the second current signal, to the first input node 316 of the integrator 302 and includes second switch circuitry 816 to selectively couple the $2*I_{ref}$ current sink 812, which provides the third current signal, to the first input node 316 of the integrator 302. The feedback control current source 802 includes DAC control logic circuitry 818 responsive to the $V_{out}$ signal and the feedback signal to control the first and second switches 814, 816 to selectively couple the second and third signals to the first input node 316 of the integrator circuit 302. The following Table 1 represents operation of the control logic circuitry 818.

TABLE 1

| $V_{out}$ | $I_{FB}$ |
|---|---|
| Off | $(k + 1) * I_{ref}$ or $(1 - k) * I_{ref}$ |
| On | $(k - 1) * I_{ref}$ or $-(k + 1)I_{ref}$ |

In accordance with some embodiments, there are four possible combinations but the fact that V out polarity acts as the driving logic signal for the feedback that leaves the oscillator signal polarity free to be logical 1 or logical 0 for a given polarity of Vout. The oscillator signal polarity determines whether a triangle waveform that is superposed to the feedback signal as in a regular sigma delta is rising or falling. The rising or falling of the triangle is uncorrelated to the feedback sign, and therefore, there exists choice of two possible current values for a given Vout polarity.

Some example advantages of the use of shared integrator capacitor circuitry 303 and an feedback control current source 802 with fewer three current sources/sinks include improved rejection of mismatch errors that otherwise could arise from using four current sources instead of three, space saving and better immunity to instability and phase match error, given that the ratio of currents selected according to the stability criteria k.

Figure 9:
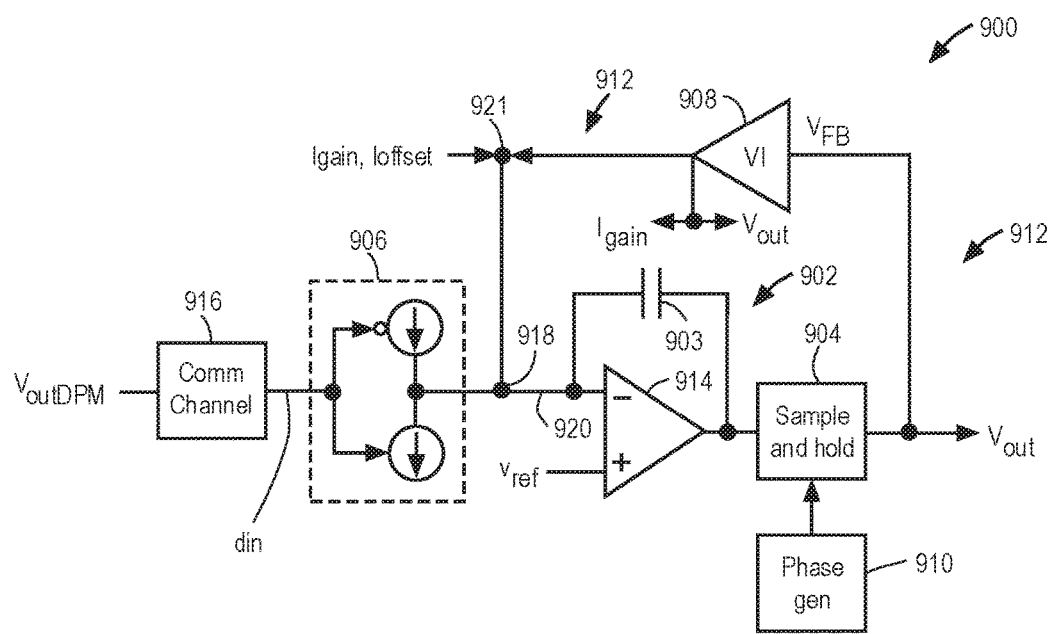
FIG. 9 is an illustrative circuit diagram representing a delta sigma PWM demodulator circuit in accordance with some embodiments.

FIG. 9 is an illustrative circuit diagram representing a delta sigma demodulator circuit ("demodulator") 900 in accordance with some embodiments. The demodulator 900 includes an integrator circuit 902, which includes an integrating capacitor 903, a gained sample-and-hold circuit 904 (gained up if active and gained down if passive), a DAC input circuit 906, a first voltage-to-current converter 908, and a phase generator circuit 910 coupled as shown. More particularly, the demodulator 900 includes a filter loop 912 that includes the integrator 903, which includes an amplifier circuit 914 like that used in the first and second modulators 300, 800, and the gained sample-and-hold circuit 904, and the first voltage-to-current converter 908, which converts a feedback voltage $V_{FB}$ output of the gained sample-and-hold circuit to an $I_{FB}$ feedback current signal. The DAC input circuit 906 is coupled to receive a binary voltage input signal sequence $d_{in}$ provided over a communication channel 916 and to convert the received binary voltage signal to a binary current signal, which is provided to a summing node 918 coupled to a first input node 920 of the integrator circuit 902. The communication channel 916 can include any communication medium suitable for transmission of a sequence of binary $d_{outDCM}$ pulses from one of the first or second modulator 300, 800, to the demodulator 900 e.g., an octocoupler, an inductive coupler, a capacitive couple, or a wire. The received binary input signal sequence $d_{in}$ is provided to the DAC input circuit 906 and to the phase generator 910. The DAC input circuit 906, in response to individual pulses of the $d_{in}$ signal, selectively couples one of an $I_{ref}$ current source and an $I_{ref}$ current sink to the summing node 918 coupled to a first input node 920 of the integrator circuit 902.

The phase generator 910, in some embodiments, generates a non-overlapped phase signal used to sample the output of the integrator synchronously to $d_{in}$ pulses, and at a frequency equal to the pulse frequency of $d_{in}$. Preferably, in accordance with some embodiments, sampling occurs during the $d_{in}$=high phase, and hold occurs during $d_{in}$=low phase, or vice versa, depending on the sign of the output of the DAC input circuit 906, respectively, when $d_{in}$ is high or low. In this illustrative example, the sampling phase corresponds to $d_{in}$=high when the DAC input circuit 904 selects the $I_{ref}$ current sink so that current is pulled from the summing node 918. In accordance with some embodiments, sampling may occur at a rising PWM edge, or alternatively, at a falling PWM edge. The gained sample-and-hold circuit 904 provides the demodulator output $V_{outD}$ that is a replica of a time varying continuous analog signal $V_{in}$ received at a corresponding one of the first and second modulators 300, 800. In some embodiments, the demodulator output signal $V_{outD}$ also is coupled to be provided as a $V_{FB}$ feedback signal received by the third voltage-to-current converter.

Figure 10:
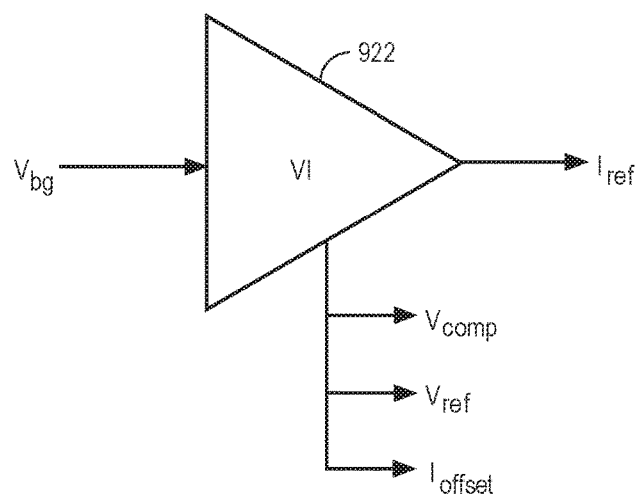
FIG. 10 is an illustrative drawing representing a fourth voltage-to-current in accordance with some embodiments.

Offset and gain trim can be applied by selectively providing an $I_{offset}$ offset current and an $I_{gain}$ gain current that are scaled replicas of currents $I_{ref}$ and $I_{FB}$, respectively, to a summing node 921 coupled to the first input node 920 the integrator 902. The first voltage-to-current converter 908 coupled in the filter loop uses a resistor network to produce $I_{gain}$ based upon $V_{FB}$. In some embodiments, a second voltage-to-current converter 922 represented in FIG. 10 uses a reference resistor network to produce voltage signal $V_{ref}$ and current signal $I_{ref}$ based upon $V_{bg}$. In some embodiments, the fourth voltage-to-current converter uses current mirror circuitry to produce $I_{offset}$ based upon $I_{ref}$. In some embodiments, $I_{offset}=±k*3I_{ref}$, and $I_{gain}=±k*4 I_{FB}$.

Also, in some embodiments, the first voltage-to-current converter 908 functions as a voltage buffer for signal the $V_{out}$ signal that is output for the sample-and-hold circuit 904 so as to produce a buffered replica of signal the demodulator $V_{out}$ signal.

The foregoing description and drawings of embodiments in accordance with the present invention are merely illustrative of the principles of the invention. Therefore, it will be understood that various modifications can be made to the embodiments by those skilled in the art without departing from the spirit and scope of the invention, which is defined in the appended claims.

The invention claimed is:

1. A delta-sigma modulator circuit comprising:
   an integrator circuit configured to produce an integrator output signal that represents an integration of an analog input signal, a feedback signal and a periodic signal;
   a comparator circuit configured to produce a continuous time comparator output voltage signal indicative of the feedback signal in response to a comparison of the integrator output signal with a first reference signal; and a periodic waveform circuit coupled to an input of the integrator circuit and configured to produce the periodic signal.

2. The delta-sigma modulator circuit of claim 1, wherein the integrator circuit is configured to produce a periodic integrator output signal that includes a ramp component.

3. The delta-sigma modulator circuit of claim 1, wherein the integrator circuit is configured to produce a periodic integrator output signal that includes a triangle signal.

4. The delta-sigma modulator circuit of claim 1, wherein the integrator circuit is configured to produce a periodic integrator output signal that includes a sawtooth signal.

5. The delta-sigma modulator circuit of claim 1, wherein the first reference signal includes a fixed value signal; and
wherein the integrator circuit is configured to produce a periodic integrator output signal that includes a ramp component.

6. The delta-sigma modulator circuit of claim 1, wherein the periodic waveform circuit is configured to produce a periodic pulse width modulated (PWM) signal.

7. The delta-sigma modulator circuit of claim 1, wherein the first reference signal includes a fixed value signal;
wherein the integrator circuit is configured to produce a periodic integrator output signal that includes a ramp component; and
wherein the periodic waveform circuit is configured to produce a periodic pulse width modulated (PWM) signal.

8. The delta-sigma modulator of claim 1, wherein the integrator circuit includes an amplifier circuit and a capacitor coupled between a first input node of the amplifier and an output node of the amplifier.

9. The delta-sigma modulator of claim 1,
wherein the integrator circuit includes an amplifier circuit and a capacitor coupled between a first input node of the amplifier and an output node of the amplifier;
wherein the first reference signal includes a fixed value signal; and
wherein the periodic waveform circuit is configured to produce a periodic pulse width modulated (PWM) signal.

10. The delta-sigma modulator circuit of claim 1, wherein the periodic waveform circuit includes: a first digital to analog converter (DAC) circuit having at least one current source, and an oscillator circuit coupled to the first DAC circuit, the delta-sigma modulator circuit further comprising:
a summing node coupled to receive a first input of the integrator circuit and coupled to receive the analog input signal;
a reference node coupled to a second input of the integrator circuit and coupled to receive a second reference signal; and
a second DAC circuit configured to convert the feedback signal from a digital voltage signal to an analog current signal and to provide the feedback current signal to the summing node.

11. The delta-sigma modulator circuit of claim 10, wherein the at least one current source includes a first current source and a second current source; and
wherein the second DAC includes a third current source and a fourth current source.

12. The delta-sigma modulator circuit of claim 1, wherein the periodic waveform circuit includes: a first digital to analog converter (DAC) circuit having at least one current source, and an oscillator circuit coupled to the first DAC circuit, the delta-sigma modulator circuit further comprising:
a summing node coupled to receive a first input of the integrator circuit and coupled to receive the analog input signal;
wherein the first DAC circuit is configured to provide one of a first, second, third and fourth analog current signals to the summing node;
selection logic circuitry configured to cause the first DAC circuit to select from among the first, second, third and fourth analog current signals based at least in part upon the comparator output voltage signal and a pulse width modulated voltage signal.

13. The delta-sigma modulator circuit of claim 12, wherein the periodic waveform circuit includes: a first digital to analog converter (DAC) circuit having at least one current score, and an oscillator circuit coupled to the first DAC circuit,
wherein the first DAC circuit includes a current source, a first current sink and a second current sink;
wherein the first analog signal includes current of the current source;
wherein the second analog signal includes a sum of current of the current source and current of the first current sink;
wherein the third analog signal includes a sum of current of the current source and current of the second current sink; and
wherein the fourth analog signal includes a sum of current of the current source, the first current sink and current of the second current sink.

14. The delta-sigma modulator circuit of claim 1, wherein the periodic waveform circuit includes: a first digital to analog converter (DAC) circuit having at least one current score, and an oscillator circuit coupled to the first DAC circuit, the delta-sigma modulator circuit further comprising:
a summing node coupled to receive a first input of the integrator circuit and coupled to receive the analog input signal;
a reference node coupled to a second input of the integrator circuit and coupled to receive a second reference signal;
wherein the first DAC circuit is configured to provide one of a first, second, third and fourth analog current signals to the summing node; and
selection logic circuitry configured to cause the first DAC circuit to produce one of the first analog current signals, the second analog current signals, the third analog current signals, and the fourth analog current signals using at least a voltage polarity of the comparator output voltage signal.

15. The delta-sigma modulator circuit of claim 14, wherein the periodic waveform circuit includes: a first digital to analog converter (DAC) circuit having at least one current score, and an oscillator circuit coupled to the first DAC circuit,
wherein the first DAC circuit includes a current source, a first current sink and a second current sink;
wherein the first analog signal includes current of the current source;

wherein the second analog signal includes a sum of current of the current source and current of the first current sink;

wherein the third analog signal includes a sum of current of the current source and current of the second current sink; and wherein the fourth analog signal includes a sum of current of the current source, the first current sink and current of the second current sink.

16. The delta-sigma modulator circuit of claim 1, further including:

a duty cycle monitor circuit configured to detect time between comparator output voltage signal pulses and to modify the comparator output voltage signal by inserting a pulse in response to a determination that a received pulse is less than a minimum pulse width and by subtracting a pulse in response to a determination that a received pulse is greater than a maximum pulse width.

17. A delta-sigma modulator circuit comprising:

means for producing an integrator output signal that represents an integration of an analog input signal, a feedback signal and a periodic signal;

means for producing a continuous time comparator output voltage signal indicative of the feedback signal in response to a comparison of the integrator output signal with a first reference signal; and means for producing the periodic waveform signal, the means for producing the waveform signal coupled to an input of the integrator circuit configured to produce the periodic signal.

18. The delta-sigma modulator circuit of claim 17, wherein the means for producing a integrator output signal that represents an integration of an analog input signal, a feedback signal and a periodic signal includes:

means for producing a periodic pulse width modulated (PWM) signal.

19. The delta-sigma modulator circuit of claim 1, wherein the periodic waveform circuit includes:

a first digital to analog converter (DAC) circuit including at least one current source; and an oscillator circuit coupled to the first DAC circuit.

20. The delta-sigma modulator circuit of claim 14, wherein the comparator circuit configured to produce the comparator output voltage signal indicative of the feedback signal is configured to produce one of a first comparator output voltage signal value and a second comparator output voltage signal value in response to the integrator output signal.

21. A method of operating delta-sigma modulator circuit, the method comprising:

coupling a periodic waveform circuit to an input of an integrator circuit and generating a periodic signal;

producing an integrator output signal that represents an integration of an analog input signal, a feedback signal and the periodic signal; and in response to a comparison of the integrator output signal with a first reference signal, producing a continuous time comparator output voltage signal indicative of the feedback signal.

22. The method of claim 21, wherein generating a periodic signal includes:

generating a periodic pulse width modulated (PWM) signal.

23. The method of claim 21, further comprising:

detecting a time between comparator output voltage signal pulses and modifying the comparator output voltage signal.

24. The method of claim 21, wherein producing an integrator output signal that represents an integration of an analog input signal, a feedback signal and the periodic signal includes:

producing a periodic integrator output signal that includes a ramp component.

25. The method of claim 21, wherein producing an integrator output signal that represents an integration of an analog input signal, a feedback signal and the periodic signal includes:

producing a periodic integrator output signal that includes a triangle signal.

26. The method of claim 21, wherein producing an integrator output signal that represents an integration of an analog input signal, a feedback signal and the periodic signal includes:

producing a periodic integrator output signal that includes a saw-tooth signal.

* * * * *

UNITED STATES PATENT AND TRADEMARK OFFICE
CERTIFICATE OF CORRECTION

PATENT NO. : 10,180,448 B2
APPLICATION NO. : 15/146647
DATED : January 15, 2019
INVENTOR(S) : Bernardinis et al.

It is certified that error appears in the above-identified patent and that said Letters Patent is hereby corrected as shown below:

In the Claims

In Column 11, Line 36, in Claim 8, after "modulator", insert --circuit--

In Column 11, Line 36, in Claim 8, after "claim 1,", insert --¶--

In Column 11, Line 40, in Claim 9, after "modulator", insert --circuit--

In Column 12, Line 23, in Claim 13, delete "score," and insert --source,-- therefor In Column 12, Line 41, in Claim 14, delete "score," and insert --source,-- therefor In Column 12, Line 62, in Claim 15, delete "score," and insert --source,-- therefor In Column 13, Line 33, in Claim 18, delete "a" and insert --an-- therefor Signed and Sealed this
Nineteenth Day of May, 2020

Andrei Iancu
*Director of the United States Patent and Trademark Office*